(12) United States Patent
Riemer et al.

(10) Patent No.: US 11,873,564 B2
(45) Date of Patent: Jan. 16, 2024

(54) ETCH CHEMISTRY FOR METALLIC MATERIALS

(71) Applicant: Hutchinson Technology Incorporated, Hutchinson, MN (US)

(72) Inventors: Douglas P. Riemer, Waconia, MN (US); Peter F. Ladwig, Hutchinson, MN (US)

(73) Assignee: Hutchinson Technology Incorporated, Hutchinson, MN (US)

( * ) Notice: Subject to any disclaimer, the term of this patent is extended or adjusted under 35 U.S.C. 154(b) by 0 days.

(21) Appl. No.: 16/591,108

(22) Filed: Oct. 2, 2019

(65) Prior Publication Data

US 2020/0102657 A1   Apr. 2, 2020

Related U.S. Application Data

(60) Provisional application No. 62/740,244, filed on Oct. 2, 2018.

(51) Int. Cl.
| | |
|---|---|
| C23F 1/16 | (2006.01) |
| H05K 1/02 | (2006.01) |
| H05K 3/06 | (2006.01) |
| C09K 13/06 | (2006.01) |
| G11B 5/48 | (2006.01) |
| C23F 1/02 | (2006.01) |

(52) U.S. Cl.
CPC ............ *C23F 1/16* (2013.01); *C09K 13/06* (2013.01); *C23F 1/02* (2013.01); *G11B 5/484* (2013.01); *H05K 1/0277* (2013.01); *H05K 3/067* (2013.01); *H05K 2203/0779* (2013.01)

(58) Field of Classification Search
None
See application file for complete search history.

(56) References Cited

U.S. PATENT DOCUMENTS

| | | |
|---|---|---|
| 6,444,140 B2 | 9/2002 | Schemenaur et al. |
| 7,056,648 B2 | 6/2006 | Cooper et al. |
| 7,153,449 B2 | 12/2006 | Hauf et al. |
| 8,891,206 B2 | 11/2014 | Miller |
| 9,296,188 B1 | 3/2016 | Cray et al. |
| 9,541,769 B2 | 1/2017 | Ladwig et al. |
| 2008/0286701 A1 | 11/2008 | Rath et al. |

(Continued)

FOREIGN PATENT DOCUMENTS

| | | | |
|---|---|---|---|
| WO | 2010/039936 | * | 10/2009 |
| WO | 2016/056835 | * | 4/2016 |

OTHER PUBLICATIONS

Andersen, P.J., et al., "Microstructural Effects during Chemical Mechanical Planarization of Copper," Journal of The Electrochemical Society, Jan. 2010, vol. 157, No. 1, pp. H120-H126.

(Continued)

*Primary Examiner* — Stephanie P Duclair
(74) *Attorney, Agent, or Firm* — DLA Piper LLP (US)

(57) ABSTRACT

An etch chemistry solution for treating metallic surfaces in which the etch chemistry solution includes an oxidizing agent and gluconic acid. The etch chemistry solution may also include an oxidizing agent and a short-chained polyethylene polymer glycol or a short-chained polyethylene copolymer glycol. The metallic surfaces are usually used in circuits such as flexible circuits.

7 Claims, 7 Drawing Sheets

(56) References Cited

U.S. PATENT DOCUMENTS

2010/0252530 A1* 10/2010 Durante ............... C23F 1/44
　　　　　　　　　　　　　　　　　　　　　　　252/79.1
2015/0307779 A1* 10/2015 Choung ............ H01L 27/124
　　　　　　　　　　　　　　　　　　　　　　　438/158
2017/0306501 A1* 10/2017 Jeon ............... H01L 27/1259

OTHER PUBLICATIONS

Dukovic, J.O., "Feature-scale simulation of resist-patterned electrodeposition," IBM Journal of Research and Development, Mar. 1993, vol. 37, No. 2, pp. 125-141.

Nakahara, S., et al., "A Model for Spontaneous Morphology Change in Electrodeposited Metal Films during Room Temperature Aging," Electrochemical and Solid-State Letters, Jan. 2007, vol. 10, No. 2, pp D17-D21.

Vas'ko, V.A., et al., "Structure and Room-Temperature Recrystallization of Electrodeposited Copper," Electrochemical and Solid-State Letters, Jul. 2003, vol. 6, No. 7, pp C100-C102.

* cited by examiner

Roughness (Ra) of Comparative Example

Roughness (Ra) of Inventive Example

ETCH CHEMISTRY FOR METALLIC MATERIALS

RELATED APPLICATIONS

This application claims the benefit of, and priority to, U.S. Provisional Patent Application Ser. No. 62/740,244, filed Oct. 2, 2018, titled Etch Chemistry for Metallic Materials, the entire disclose of which is hereby incorporated by reference.

TECHNICAL FIELD

The present invention relates to a chemistry for etching metallic materials. More specifically, the invention relates to a chemistry for etching surfaces of metallic materials used in circuits such as, for example, flexible circuits.

BACKGROUND

Flexible circuits typically include conductive and insulating layers. Flexures are structures that flexibly support a read/write transducer proximate a rotating disk, while also supporting flexible electrical circuitry for conducting electrical signals to and from a transducer. To form good adhesion between conductive and insulating layers of a flexible circuit, a seed layer is used. In one process, a seed layer is formed directly on an insulating layer, a resist is then located in areas where the conductive material is not to be formed, and then conductive material is located in areas where the resist in not present. After removing the resist layer, the portion of the seed layer that was underneath the resist layer needs to be removed. To remove this portion of the seed layer, an etch is typically used.

This portion of the seed layer may be removed by an etch chemistry and is typically referred to as micro-etching. Existing techniques typically will roughen the surface during the removal of this portion of the seed layer to assist in the process of forming another attached layer. When the conductive material is roughened, it makes it more difficult to later differentiate between the distinct layers when optically inspected by an automated process. By better differentiating between layers such as the conductive and dielectric layers, the optical inspection can identify if there are any opens or shorts in the conductive material. When the conductive material remains smoother, the optical inspection by the automated process works much better in differentiating between the layers. Thus, the texture and consistency of the texture of the conductive material is very important in differentiating the layers. Thus, it would be desirable to have an etch chemistry that can remove this portion of the seed layer, while still maintaining a consistent and smoother surface of the conductive layer to assist in the automated optical inspection.

In another aspect, providing etch chemistry and methods of etching that produce a smooth conductive layer may be useful in other applications, such as for example in the manufacture of thin film devices, sensors and other electronic components.

SUMMARY

According to one embodiment, an etch chemistry solution is used for treating metallic surfaces. The etch chemistry solution comprises an oxidizing agent and gluconic acid.

According to another embodiment, an etch chemistry solution is used for treating metallic surfaces. The etch chemistry solution comprises an oxidizing agent and a short-chained polyethylene polymer glycol or a short-chained polyethylene copolymer glycol.

According to one method, a material is formed for a circuit. The method comprises forming a substrate and forming a dielectric polymer layer. A seed layer is formed in which the dielectric polymer layer is located between the substrate and the seed layer. Conductive material is placed on a first portion of the seed layer. A second portion of the seed layer is etched in which the first and second portions of the seed layer are different. The etching is performed by an etch chemistry solution. The etch chemistry solution comprises an oxidizing agent and gluconic acid.

According to another method, a material is formed for a circuit. The method comprises forming a substrate and forming a dielectric polymer layer. A seed layer is formed in which the dielectric polymer layer is located between the substrate and the seed layer. Conductive material is placed on a first portion of the seed layer. A second portion of the seed layer is etched in which the first and second portions of the seed layer are different. The etching is performed by an etch chemistry solution. The etch chemistry solution comprises an oxidizing agent and a short-chained polyethylene polymer glycol or a short-chained polyethylene copolymer glycol.

In another embodiment, a method of etching a metallic material is provided, comprising exposing a surface of the metallic material to an etch chemistry solution comprising an oxidizing agent and gluconic acid. In another embodiment, a method of etching a metallic material is provided, comprising exposing a surface of the metallic material to an etch chemistry solution comprising an oxidizing agent and a short-chained polyethylene polymer glycol or a short-chained polyethylene copolymer glycol. In yet another embodiment, a method of etching a metallic surface is provided, comprising the steps of: exposing a surface of the metallic material to an etch chemistry solution comprising an oxidizing agent and gluconic acid, etching the surface of the metallic material wherein the surface exhibits a surface roughness of as measured by Ra of less that 50 nm after etching. In one non-limiting example the metallic material is comprised of copper.

In another aspect, a device having at least one conductive layer with a smooth surface is formed, comprising the steps of: forming one or more conductive layers on a substrate and exposing a surface of the one or more conductive layers to an etch chemistry solution comprising an oxidizing agent and gluconic acid, etching the surface of the one or more conductive layers wherein the surface exhibits a surface roughness as measured by Ra of less than 50 nm after etching. In another embodiment, the etch chemistry solution comprises an oxidizing agent and a short-chained polyethylene polymer glycol or a short-chained polyethylene copolymer glycol. In another embodiment, the surface roughness as measured by Ra is less than 20 nm, and in some embodiments is less than 10 nm. The device formed by this inventive method may be any suitable device, in addition to flexible circuits, may be a thin film device. Providing a smooth conductive layer according to the inventive method is particularly advantageous in the manufacture of thin film devices, such as where a thin layer is subsequently formed on the conductive layer, such as by sputter deposition. In additional embodiments, devices formed by the inventive method having one or more smooth conductive layers may comprise other flexible circuits such as without limitation: thin film devices, MRAM devices, sensors, such as but not limited to chemical sensors, optical image stabilization components such as but not limited to those used in camera assemblies in mobile phones, actuator components and suspension assemblies such as but not limited to those used in hard disk drives.

Figure 1:
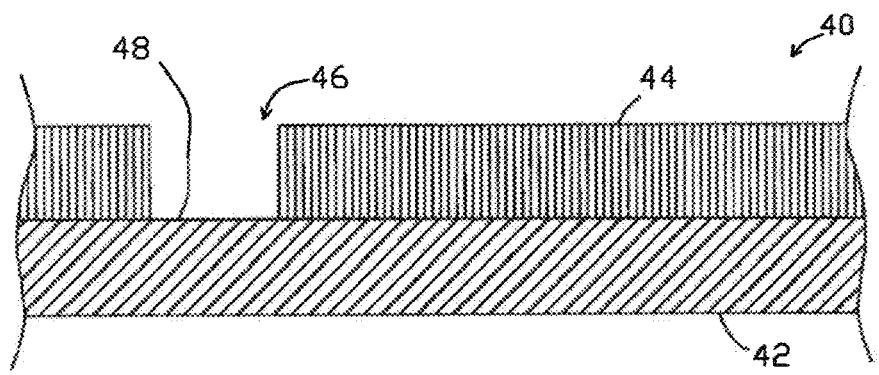
FIG. 1 is a generally cross-sectional view of a portion a flexible circuit with at least one opening in a dielectric polymer layer is shown according to one embodiment.

While the invention is amenable to various modifications and alternative forms, specific embodiments have been shown by way of example in the drawings and are described in detail below. The intention, however, is not to limit the invention to the particular embodiments described. On the contrary, the invention is intended to cover all modifications, equivalents, and alternatives falling within the scope of the invention as defined by the appended claims.

DETAILED DESCRIPTION

Embodiments described below disclose etch chemistry and processes to be used for treating metallic surfaces such as in methods of forming circuits. One non-limiting example of a circuit is a flexible circuit. In some embodiments, the flexible circuits are flexures of a hard disk drive suspension, such as a suspension of U.S. Pat. Nos. 9,296,188 or 8,891, 206, or such as a SMA-OIS assembly of U.S. Pat. No. 9,541,769, all of which are hereby incorporated by reference in their respective entireties.

The etch chemistry solutions of the present invention are used with metallic or conductive material that can be etched or typically micro-etched. The etch chemistry solution in one process is used to etch or oxidize only to a limited extent. In one process, the etch chemistry solution micro-etches the surfaces of conductive material, which leaves intact the original pattern of the conductive material being etched. In another process, the etch chemistry solution removes a thin seed layer and micro-etches surfaces of conductive material. In a further process, the etch chemistry solution etches one metal surface, while not etching another metal surface. It is contemplated that other processes can be used for etching metallic material using the etch chemistry solutions of the present invention.

The etch chemistry solutions of the present invention in one process micro-etch the metallic material, resulting in a consistent, smooth surface that is desirable in automated optical inspection. The etch chemistry solutions of the present invention are insensitive to the grain size of the conductive material. The metallic material does not anneal much, if any, which avoids rougher surfaces on the conductive material. This includes surfaces that have a wide range of grain sizes (e.g., from about 50 nm to about 5 microns).

The surfaces of the metallic surfaces or conductive materials to be micro-etched are typically copper and copper alloys. It is contemplated that surfaces of other conductive materials may be micro-etched such as cobalt, zinc, nickel, iron, gold, silver and alloys thereof.

In one embodiment, the etch chemistry solution for etching metallic material includes an oxidizing agent and a gluconic acid. The oxidizing agent for use in the etch chemistry solution includes peroxides, persulfate compounds, ferric compounds, cupric compounds, nitric acid, chlorite or combinations thereof. A non-limiting example of a peroxide that may be used in the etch chemistry solution is hydrogen peroxide. Non-limiting examples of persulfate compounds that may be used in the etch chemistry solution include, but are not limited to, sodium persulfate, potassium persulfate, monopersulfates, and ammonium persulfate.

The oxidizing agent is generally from about 10 to about 300 g/L of the etch chemistry solution and, more specifically, from about 25 to about 100 g/L of the etch chemistry solution. In a more detailed embodiment, the oxidizing agent is generally from about 25 to about 75 g/L of the etch chemistry solution. For example, if the oxidizing agent is a chlorite, the oxidizing agent is generally from about 25 to about 100 g/L. If the oxidizing agent is a persulfate, the oxidizing agent is generally from about 25 to about 75 g/L.

The gluconic acid in the etch chemistry solution assists in providing a proper balance of surface energy control and etch rate. The gluconic acid does not stop the etch, but assists in maintaining a uniform etch rate. The gluconic acid is generally from about 1 to about 25 g/L of the etch chemistry solution and, more specifically, from about 1 to about 5 g/L of the etch chemistry solution. In a more detailed embodiment, the gluconic acid is generally from about 1 to about 2 g/L of the etch chemistry solution. If the gluconic acids are longer chained, the amount of gluconic acid will be less than if shorter chained gluconic acids are used.

In another embodiment, the etch chemistry solution includes an oxidizing agent, a gluconic acid and a non-oxidizing/reducing acid. Non-limiting examples of non-oxidizing/reducing acids that may be used in the etch chemistry solution include, but are not limited to, sulfuric acid, acetic acid, formic acid, lactic acid, phosphoric acid or combinations thereof. Sulfuric acid is especially desirable in the etch chemistry solution if the metallic material to be etched is copper or a copper alloy. In this embodiment, the sulfuric acid assists in removing oxides from the copper prior to etching, which allows a more uniform etch rate that leads to smoother surfaces. The non-oxidizing/reducing acid desirably does not react with the oxidizing agent.

The non-oxidizing/reducing acid used in the etch chemistry solution is generally from about 0.1 to about 4N and, more specifically, from about 0.5 to about 1N.

It is contemplated that other components may be added to the etch chemistry solution. For example, a metal activator may be added to the etch chemistry solution. A metal activator acts as a catalyst that speeds up and maintains the etch rate from the etch chemistry solution. The metal activator is typically a transition metal. The metal activator may include, but is not limited to, copper, cobalt, zinc, nickel, iron, manganese or alloys thereof. The metal activator is often the same material as that being etched. For example, if a copper or copper alloy is being etched, the metal activator is desirably copper or a copper alloy. The metal activator is generally from about 50 to about 1,000 ppm and, more specifically, from about 100 to about 500 ppm of the etch chemistry solution.

To improve the bath solubility and stability, additional components may be added to the etch chemistry solution in further embodiments. For example, sodium sulfate or potassium sulfate may be added to the etch chemistry solution to assist in stabilizing the reaction rate.

Surfactants may be added to the etch chemistry solution to improve the surface wetness as the work article contacts the etch chemistry solution, which assists in providing a better and more consistent etch. The surfactant may be a non-ionic or ionic surfactant. The surfactant is used typically in an amount of from about 10 to about 1,000 ppm and, more specifically, from about 50 ppm to about 250 ppm.

In one embodiment, a desirable etch chemistry solution includes from about 0.5 to about 1.5N sulfuric acid, from about 50 to about 150 g/L sodium persulfate, from about 1 to about 5 g/L gluconic acid, from about 100 to about 250 ppm copper.

In another embodiment, the etch chemistry solution for etching metallic material includes an oxidizing agent and a short-chained polyethylene polymer glycol. The short-chained polyethylene polymer glycol is defined as a 3 to 6 repeat glycol ether. In a further embodiment, the etch chemistry solution for etching metallic material includes an oxidizing agent and a short-chained polyethylene copolymer glycol such as, for example, a short-chained polypropylene/polyethylene copolymer glycol.

One non-limiting example of a short-chained polyethylene polymer glycol is $(C_{14}H_{22}O(C_2H_4O)_n)$, which is a nonionic surfactant that has a hydrophilic polyethylene oxide chain (on average it has 9.5 ethylene oxide units) and an aromatic hydrocarbon lipophilic or hydrophobic group. The hydrocarbon group is a 4-(1,1,3,3-tetramethylbutyl)-phenyl group. It is contemplated that other short-chained polyethylene polymer glycols may be used. For example, it is contemplated that xylonic acid, threonic acid, or D-glucose peracetate may be used.

The short-chained polyethylene polymer or copolymer glycol is generally from about 0.1 to about 5 g/L of the etch chemistry solution and, more specifically, from about 0.3 to about 3 g/L of the etch chemistry solution. In a more detailed embodiment, the short-chained polyethylene polymer or copolymer glycol is generally from about 0.5 to about 1 g/L of the etch chemistry solution.

A non-limiting commercial example of a short-chained polyethylene copolymer glycol is Triton X-100, which is sold by Dow Chemical Company. A non-limiting commercial example of a short-chained polypropylene/polyethylene copolymer glycol is UCON™ 50-HB-100, which is sold by Dow Chemical Company. It is contemplated that other short-chained polyethylene copolymer glycols may be used.

In one embodiment, a desirable etch chemistry solution includes from about 0.5 to about 1.5N sulfuric acid, from about 50 to about 150 g/L sodium persulfate, from about 0.3 to about 3 g/L polyethylene polymer or copolymer glycol, from about 100 to about 250 ppm copper.

Etching Process

The etch chemistry solution etches metallic materials in one process at a temperature from about 25 to about 50° C. and, more specifically, from about 30 to about 45° C. in another process. The temperature assists in providing a desirable etch rate, while at the same resulting in a smoother surface in the metallic material. The etch rate using the etch chemistry solution is generally from about to about 5 to about 30 nm/min. and, more specifically, from about 10 to about 20 nm/min.

The etch chemistry solution of the present invention is suitable for processes in which a metal surface (e.g., a circuit such as a flexible circuit) is immersed in the solution. The etch chemistry solution of the present invention also is suitable for etching a metallic surface using a conveyorized spray system.

As discussed above, the etch chemistry solution is used in etching metallic surfaces. One example of a metallic material that may be etched is a circuit such as a flexible circuit. A non-limiting example of forming a flexible circuit using the etch chemistry solution will be described according to one process.

Referring to FIG. 1, a generally cross-sectional view of a portion a flexible circuit with at least one opening in a dielectric polymer layer is shown according to one embodiment. The flexible circuit may be a flexure. FIG. 1 shows a flexible circuit 40 including a substrate 42, a dielectric polymer layer 44, and an opening 46. The substrate 42 in one embodiment is a flexible metallic substrate. The substrate 42 desirably comprises stainless steel. In other embodiments, the substrate 42 may comprise other types of metals, such as copper, phosphorus bronze, nickel, titanium or alloys thereof such as, for example, nitinol. The metal does not have to be continuous in the substrate, but is used in at least the areas where a circuit is desired.

The dielectric polymer layer 44 may comprise a suitable, curable polymer. One non-limiting example that may be used to form the dielectric polymer layer 44 is polyimide. The dielectric polymer layer 44 is disposed on a surface 48 of the substrate 42. The opening 46 is an opening in the dielectric polymer layer 44 that extends through the dielectric polymer layer 44 to expose a portion of the surface 48. The opening 46 may be used to establish an electrical connection between a conductive material (e.g., a conductive structure) formed on the dielectric polymer layer 44 (e.g., conductive structure 56a, FIG. 5) and the substrate 42.

In some embodiments, the dielectric polymer layer 44 may be formed by depositing a photoimageable polyimide precursor onto the surface 48, followed by photolithographic processes well known in the art, including exposing the polyimide precursor through a photomask and developing the same to form the opening 46. Once the opening 46 is formed, the polyimide precursor is cured to form the polyimide.

Figure 2:
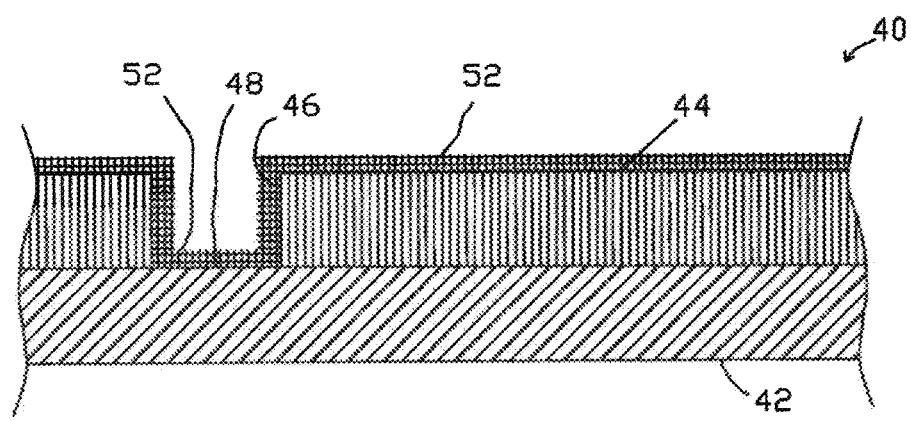
FIG. 2 is a generally cross-sectional view of the portion of the flexible circuit shown in FIG. 1 after deposition of a seed layer according to one embodiment.

FIG. 2 is a generally cross-sectional view of the portion of the flexible circuit 40 showing additional processing according to one embodiment after the processing described above in reference to FIG. 1. FIG. 2 shows a seed layer 52 deposited on an upper surface of the dielectric layer 44 and the exposed portion of the surface 48 of the substrate 42. The seed layer 52 assists in adhering the dielectric layer 44 and a conductive layer or structure as will be discussed below. The seed layer 52 forms a low resistance electrical connection with the substrate 42. The seed layer 52 may be formed, for example, by sputter deposition of a metallic layer (e.g., a chromium layer) onto the dielectric layer 44 and the exposed portion of the surface 48 of the substrate 42.

The thickness of the seed layer 52 is generally from about 200 to about 1,250 Å and, more specifically, from about 300 to about 600 Å.

Figure 3:
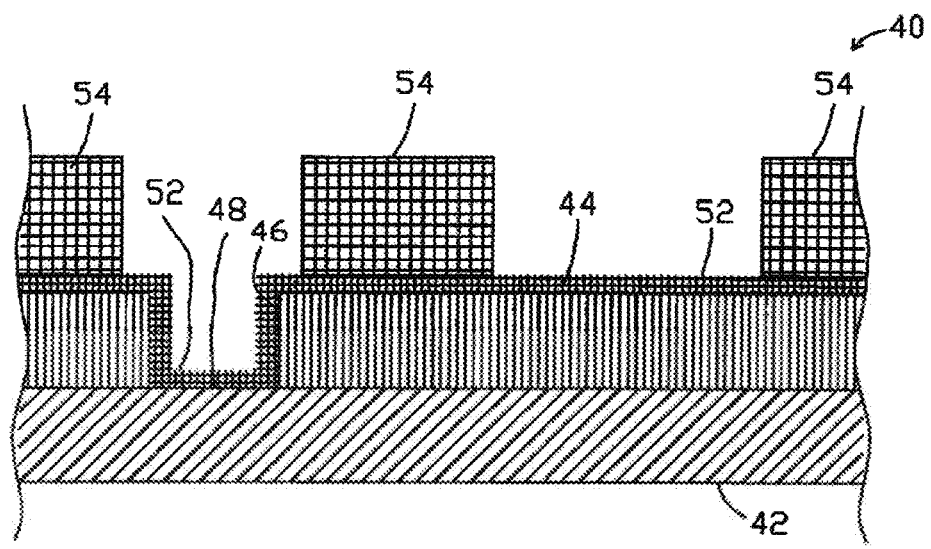
FIG. 3 is a generally cross-sectional view of the portion of the flexible circuit shown in FIG. 2 after forming a patterned photoresist layer according to one embodiment.

FIG. 3 is a generally cross-sectional view of the portion of the flexible circuit 40 showing additional processing according to one embodiment after the processing described above in FIG. 2. FIG. 3 shows a patterned photoresist layer 54 formed on an upper surface of the seed layer 52. The patterned photoresist layer 54 can be formed by photolithographic techniques well known in the art.

Figure 4:
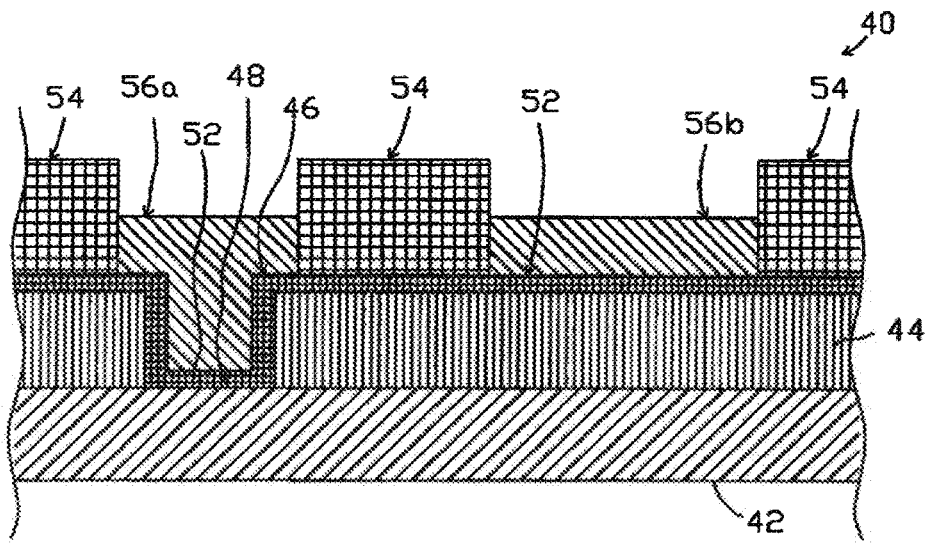
FIG. 4 is a generally cross-sectional view of the portion of the flexible circuit shown in FIG. 3 after electroplating a conductive material onto portions of the seed layer to form conductive structures according to one embodiment.

FIG. 4 is a generally cross-sectional view of the portion of the flexible circuit 40 showing additional processing according to one embodiment after the processing described above in FIG. 3. FIG. 4 shows the formation of a plurality of conductive structures 56a, 56b on the seed layer 52. The plurality of conductive structures 56a, 56b can be formed by electroplating a conductive material (e.g., a copper or a copper alloy) onto portions of the seed layer 52 not covered by the patterned photoresist layer 54. The patterned photoresist layer 54 blocks deposition of the conductive metal onto the seed layer 52. While just two conductive structures, 56a and 56b, are shown for ease of illustration, it is understood that embodiments may include more than two conductive structures.

Figure 5:
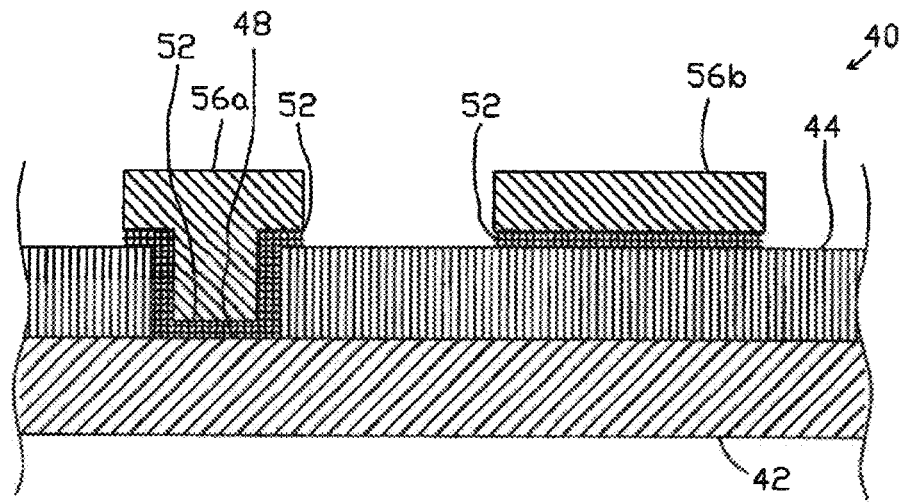
FIG. 5 is a generally cross-sectional view of the portion of the flexible circuit shown in FIG. 4 after removing the patterned photoresist layer and a portion of the seed layer according to one embodiment.

FIG. 5 is a generally cross-sectional view of the portion of the flexible circuit 40 showing additional processing according to one embodiment after the processing described above in FIG. 4. FIG. 5 shows the flexible circuit 40 after removing the patterned photoresist layer 54 and removing a portion of the seed layer 52. The patterned photoresist layer 54 can be removed by, for example, any of a number of chemical photoresist strippers known in the art. After the patterned photoresist layer 54 is removed exposing a portion of the seed layer 52, the exposed portion of the seed layer 52 is etched away by the etch chemistry solutions described in detail above. The etch chemistry solutions also contact the conductive structures 56a, 56b.

The surfaces of the conductive structures 56a, 56b remain smooth after the micro-etching by the etch chemistry solutions of the present invention. The surface roughness of the structure as measured by Ra is generally less than about 50 nm and more desirably less than about 25 nm or about 20 nm. The surface roughness of the structure as measured by Ra may be less than about 10 nm.

Figure 6:
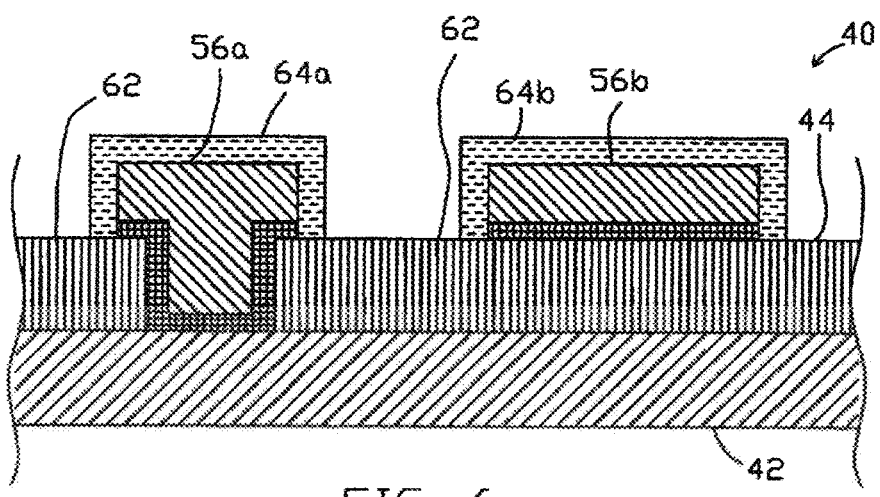
FIG. 6 is a generally cross-sectional view of the portion of the flexible circuit shown in FIG. 5 after electroless deposition of another conductive structure onto the conductive structures according to one embodiment.

FIG. 6 is a generally cross-sectional view of the portion of the flexible circuit 40 showing additional processing according to one embodiment after the processing described above in FIG. 5. FIG. 6 shows the flexible circuit 40 after electroless deposition of another conductive metal 64a, 64b onto the respective conductive structures 56a, 56b. In one method, the automated optical inspection typically occurs after additional process steps (e.g., the electroless deposition or other step(s)). The electroless deposition is a very thin layer and does not materiality affect the smoothness of the conductive structures 56a, 56b.

Figure 7:
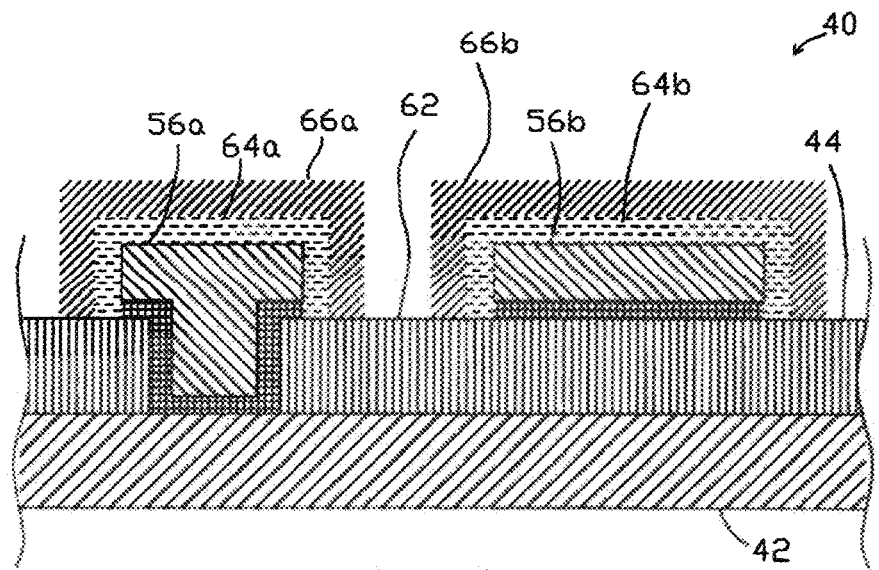
FIG. 7 is a generally cross-sectional view of the portion of the flexible circuit shown in FIG. 6 after forming a cover coat on the conductive structures according to one embodiment.

FIG. 7 is a generally cross-sectional view of the portion of the flexible circuit 40 showing additional processing according to one embodiment after the processing described above in FIG. 6. The additional processing may be an added layer or multiple layers. After functionalizing an exposed portion 62 of the surface of the dielectric polymer layer 44, a dielectric polymer coating 66a, 66b can be formed on the respective conductive structures 56a, 56b and at least the part of the exposed portion 62 that is adjacent to the conductive structures 56a, 56b to form a cover coat.

The dielectric polymer coating 66a, 66b may be made of any suitable, curable polymer, such as a polyimide. In some embodiments, the dielectric polymer coating 66a, 66b may be formed by depositing a photoimageable polyimide precursor onto the conductive structures 56a, 56b and the exposed portion 62, followed by photolithographic processes well known in the art, including exposing the polyimide precursor through a photomask and developing to define the dielectric polymer coating 66a, 66b. Once the dielectric polymer coating 66a, 66b is formed, the polyimide precursor is cured to form the polyimide and the dielectric polymer coating 66a, 66b is heat bonded to the dielectric polymer layer 44. It is contemplated that the polymer coating may be a liquid coating or a dry lamination.

Although the embodiments in FIGS. 6 and 7 show the functionalization of the exposed portion 62 and the application of the dielectric polymer coating 66a, 66b following the electroless deposition of the conductive metal 64a, 64b, in other embodiments, the conductive metal 64a, 64b may be omitted.

Figure 8:
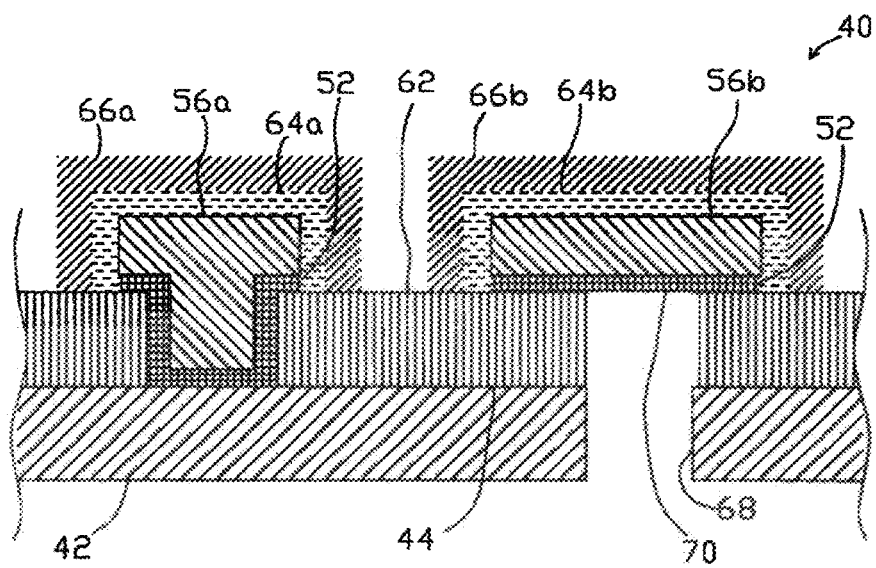
FIG. 8 is a generally cross-sectional view of the portion of the flexible circuit shown in FIG. 7 after formation of an opening in the metal substrate on a side opposite the dielectric polymer layer and etching the dielectric polymer layer through the opening in the metal substrate according to one embodiment.

FIG. 8 is a generally cross-sectional view of the portion of the flexible circuit 40 showing additional processing according to one embodiment after the processing described above in FIG. 7. FIG. 8 shows the formation of an access hole through the substrate 42 and the dielectric layer 44. An opening 68 through the substrate 42 may be formed on a side opposite the dielectric polymer layer 44 (backside). The opening 68 may be formed by, for example, patterning a photoresist on the backside of the flexible circuit 40 and then etching the substrate 42 with an etchant suitable for material of the substrate 42. For example, if the substrate 42 is made of stainless steel, then a suitable etchant would dissolve stainless steel without aggressively attacking the photoresist. Such etchants are known in the art. After the opening 68 through the substrate 42 is formed, the dielectric polymer layer 44 can be etched, using the substrate 42 as a mask, to extend the opening 68 to expose a portion 70 of the seed layer 52 underlying the conductive structure 56b.

Figure 11:
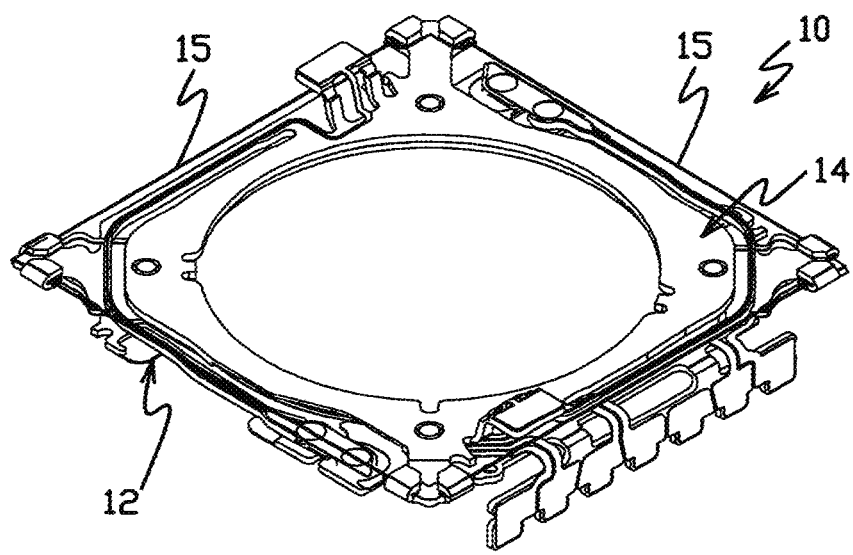
FIG. 11 is a top isometric view of a flexible printed circuit comprised of a shape memory alloy optical image stabilization (SMA-OIS) suspension formed according to some embodiments of the present disclose.

FIG. 11 shows another example of a flexible circuit formed according to method of the present disclosure. In the exemplary embodiment illustrated in FIG. 11, a flexible printed circuit is comprised of a shape memory alloy optical image stabilization (SMA-OIS) suspension assembly 10 having a flexible printed circuit or support member 12 and a spring crimp circuit or moving member 14 that is coupled to the support member 12. Shape member allow wires 15 extend between the support member 12 and the moving member 14 and can be electrically actuated to move and control the position of the moving member 14 with respect to the support member 12. Assembly 10 is a suspension assembly of a camera lens optical image stabilization device that may be used in mobile devices such as mobile phones, tablets and laptop computers.

Figure 12:
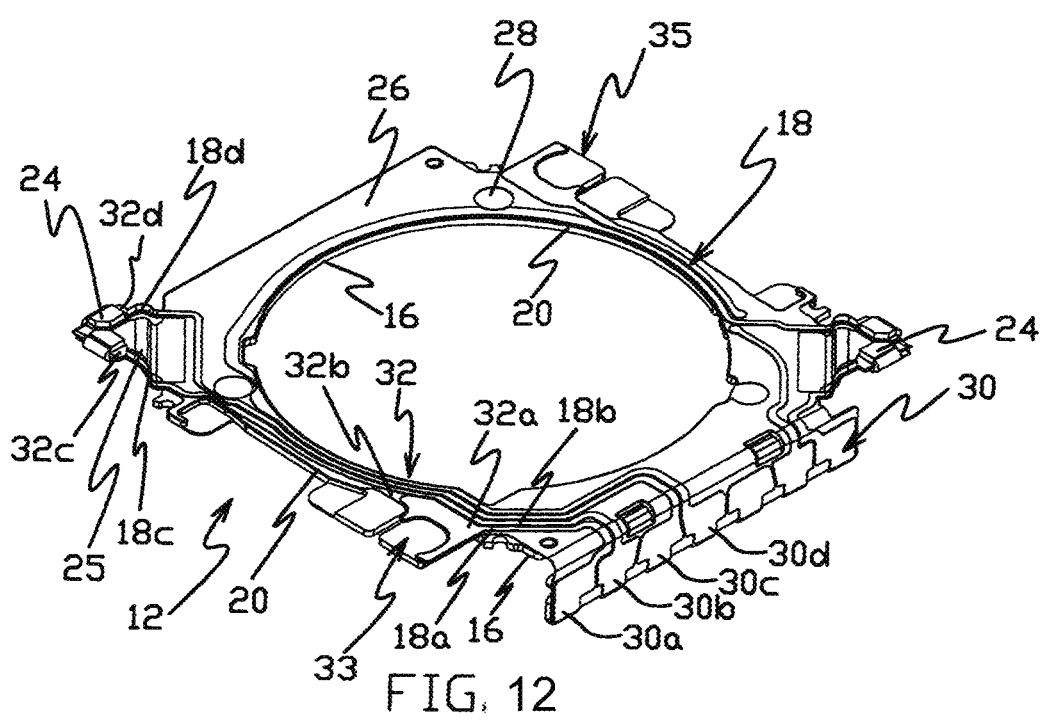
FIG. 12 is a top isometric view of the support member of the SMA-OIS suspension shown in FIG. 11.

FIG. 12 illustrates the support member 12 of the SMA-OIS suspension shown in FIG. 11 in more detail. In the exemplary embodiment, the support member 12 includes a base layer 16 and one or more conductive traces 18, such as conductive traces 18a-18d in a conductor layer on the base layer 16. A layer of dielectric 20 is located between the conductive traces 18 and the base layer 16 to electrically insulate the traces from the base layer 16, which can be metal such as stainless steel. One or more wire attachment structures such as crimps 24 are located on the base layer 16. In the illustrated embodiment the crimps 24 are organized as two pairs of adjacent structures that are integrally formed on a ledge 25 in the base layer 16 at a level spaced (e.g., in a z-direction) from a major planar surface portion 26 of the base layer. Other embodiments may include other wire attach structures (e.g., solder pads) and/or wire attach structures that are organized in other arrangements (e.g., singly rather than in pairs). In one example bearing-retaining recesses 28 are formed in the portion 26 of base layer 16, and bearings in the recesses 28 can engage the moving member 14 and movably support the moving member with respect to the support member 12.

The conductive traces 18 include terminals 30 and contact pads 32 in the conductor layer on the base layer 16. Each of the traces 18 couples a terminal 30 to a contact pad 32. For example, contact pads 32a and 32b are at a first mount region 33 of the support member 12, and traces 18a and 18b couple terminals 30a and 30b to pads 32a and 32b, respectively. Contact pads 32 at a second mount region 35 are similarly coupled to terminal 30 by traces 18. A contact pad 32 is located at each of the crimps 24 in the illustrated embodiment, and each of the contact pads is coupled by a separate trace to a separate terminal 30 (e.g., trace 18d couples terminal 30d to pad 32d). The portion of the base layer 16 on which the terminals 30 are located is formed out of the plane of the major surface portion 26 (e.g., perpendicular to the plane of the major surface portion in the illustrated embodiment). In the illustrated embodiment, the crimps 24 are unitary with and formed from the same piece of material of the base layer 16 as the surface portion 26.

Figure 13:
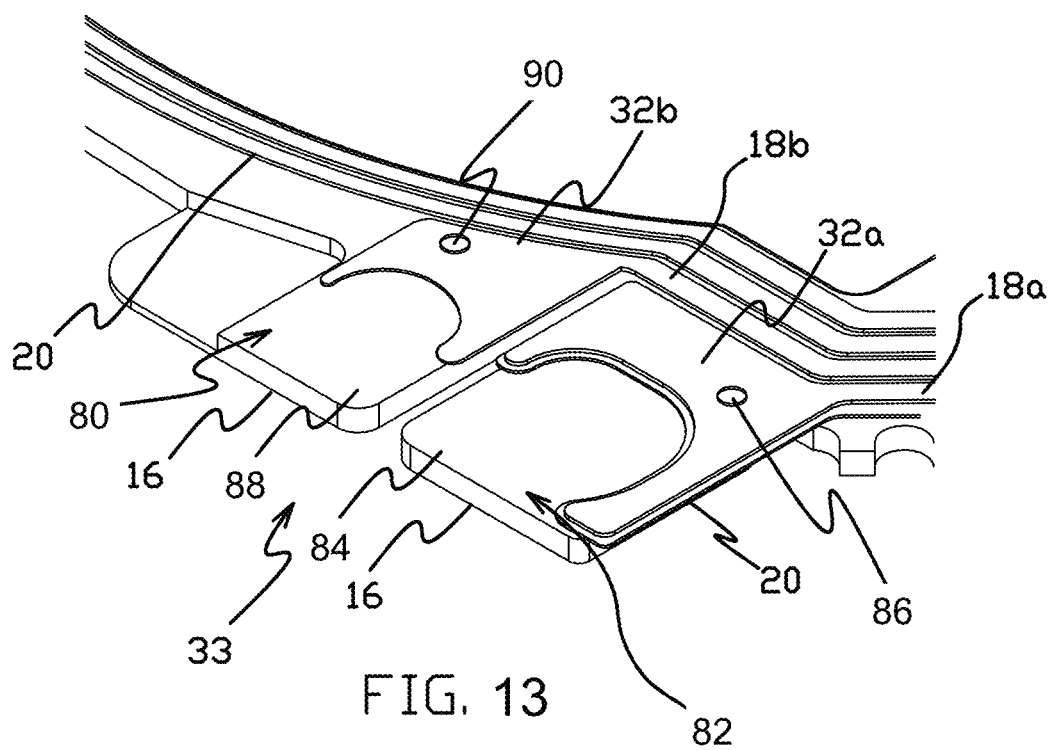
FIG. 13 is a partial top isometric view of a mount region of the support member shown in FIG. 12 showing conductive traces formed according to some embodiments of the present disclosure.

FIG. 13 illustrates the mount region 33 of the support member 12 in greater detail. As shown, the mount region 33 includes first and second mounting pads 80 and 82. Mounting pad 82 includes an island or pad portion 84 in the base layer 16 that is electrically isolated from other portions of the base layer. The island pad portion 84 can be supported in part from adjacent portions of the base layer 16 by areas of dielectric 20 that extend between the island pad portion and adjacent portions of the base layer. Trace 18a and contact pad 32a extend to the island pad portion 84, and in embodiments are electrically connected to the island pad portion 84 by an electrical connection such as a plated or other via 86 that extends through the dielectric 20 at the mounting pad 82. Other embodiments include other electrical connections in place of or in addition to via 86, such as, for example, conductive adhesive that extends between the contact pad 32a and island pad portion 84 over the edges of the dielectric 20. Mounting pad 80 is adjacent to mounting pad 82, and includes a pad portion 88 in the base layer 16 (that in embodiments functions as an electrical ground or common structure), and an electrical connection such as via 90 that connects the contact pad 32b to the pad portion 88.

The conductive traces 18 can be formed to according the methods disclosed herein to form the conductive traces 18 having a smooth surface. Specifically, the conductive traces are formed using an etch chemistry solution comprising an oxidizing agent and gluconic acid. In some embodiments, the conductive traces are formed and treated using comprising an oxidizing agent and a short-chained polyethylene polymer glycol or a short-chained polyethylene copolymer glycol.

As described above and with reference to the figures, the conductive traces are formed in general by forming a dielectric polymer layer on a substrate, forming a seed layer in which the dielectric polymer layer is located between the substrate and the seed layer; placing conductive material on a first portion of the seed layer; and etching a second portion of the seed layer, the first and second portions of the seed layer being different, the etching being performed by an etch chemistry solution, the etch chemistry solution comprising an oxidizing agent and gluconic acid. In some embodiments, the conductive traces exhibit a surface roughness after etching as measured by Ra of less than 50 nm. In other embodiments, the conductive traces exhibit a surface roughness after etching as measured by Ra of less than 20 nm, and in some embodiments less than 10 nm.

Various modifications and additions can be made to the exemplary embodiments discussed without departing from the scope of the present invention. For example, while the embodiments described above refer to particular features, the scope of this invention also includes embodiments having different combinations of features and embodiments that do not include all of the described features. Accordingly, the scope of the present invention is intended to embrace all such alternatives, modifications, and variations as fall within the scope of the claims, together with all equivalents thereof.

EXAMPLES

To assist in showing the desirability of adding gluconic acid to an etch chemistry solution, a comparative example and an inventive example were made and compared. The etch chemistry solution in the Comparative Example included 15 g/L of sodium persulfate, 1.2 N sulfuric acid and 250 ppm of copper. The etch chemistry solution in the Inventive Example included 15 g/L of sodium persulfate, 1.2 N sulfuric acid, 250 ppm of copper and 17 ml/L of gluconic acid.

Figure 9:
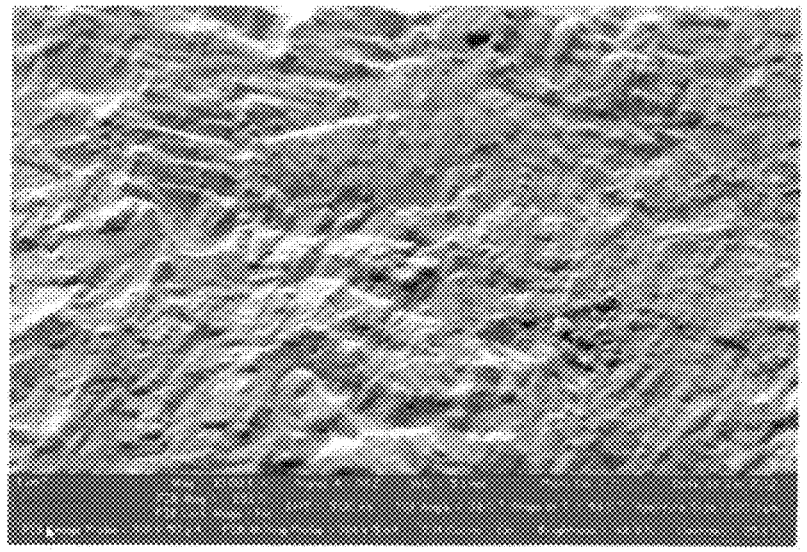
FIG. 9 is an enlarged depiction of surface roughness (Ra) in a comparative example.
Figure 10:
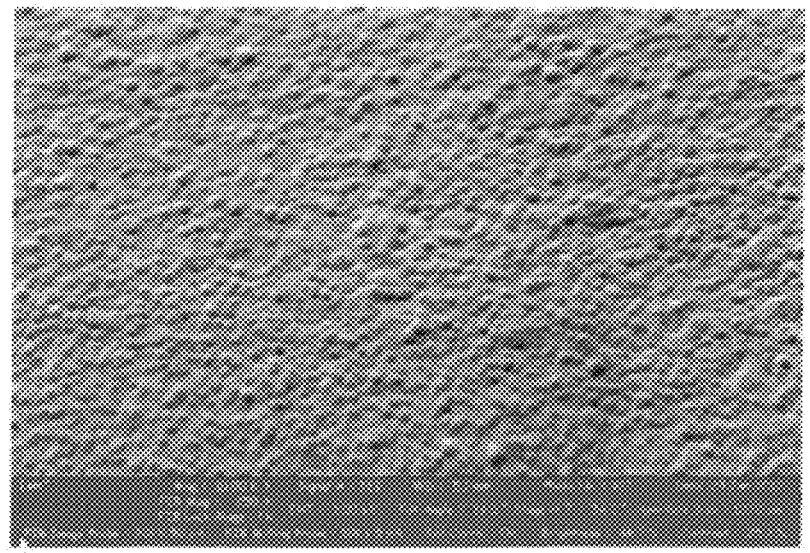
FIG. 10 is an enlarged depiction of surface roughness (Ra) in an inventive example.

Each of the etch chemistry solutions of the Comparative Example and the Inventive Example was used on a copper seed layer. The results of the etching of the copper seed layer using the etch chemistry solution of the Comparative Example are shown in FIG. 9. The results of the etching of the copper seed layer using the etch chemistry solution of the Inventive Example are shown in FIG. 10. FIG. 9 (Comparative Example) showed highly textured surfaces with darken areas. FIG. 10 (Inventive Example) showed smoother surfaces that were much brighter. The Inventive Example with gluconic acid in the etch chemistry solution unexpectedly produced a much better etch than the Comparative Example without gluconic acid.

What is claimed is:

1. An etch chemistry solution for treating metallic surfaces, the etch chemistry solution consisting of:
   an oxidizing agent comprising one or more of a peroxide, a persulfate compound, and combinations thereof;
   one or more of a short-chained polyethylene polymer glycol and a short-chained polyethylene copolymer glycol, wherein the short-chained polyethylene polymer glycol is xylonic acid, threonic acid, or D-glucose peracetate;
   a non-oxidizing/reducing acid comprising one or more of sulfuric acid, acetic acid, formic acid, lactic acid, phosphoric acid or combinations thereof;

a metal activator comprising one or more of copper, cobalt, zinc, nickel, iron, manganese or alloys thereof; and optionally a surfactant.

2. The etch chemistry solution of claim 1, wherein the short-chained polyethylene copolymer glycol comprises a polyethylene/polypropylene copolymer glycol.

3. An etch chemistry solution for treating metallic surfaces, the etch chemistry solution comprising:

an oxidizing agent; and a short-chained polyethylene polymer glycol, wherein the short-chained polyethylene polymer glycol is xylonic acid, threonic acid, or D-glucose peracetate.

4. The etch chemistry solution of claim 3, wherein the oxidizing agent comprises one or more of a peroxide, a persulfate compound, and combinations thereof.

5. The etch chemistry solution of claim 3, further comprising a short-chained polyethylene copolymer glycol comprising a polyethylene/polypropylene copolymer glycol.

6. The etch chemistry solution of claim 3, further comprising a metal activator comprising one or more of copper, cobalt, zinc, nickel, iron, manganese or alloys thereof.

7. The etch chemistry solution of claim 3, further comprising a surfactant.

* * * * *